(12) United States Patent
Seymour

(10) Patent No.: US 8,208,874 B2
(45) Date of Patent: Jun. 26, 2012

(54) RF POWER AMPLIFIERS

(75) Inventor: Christopher David Seymour, Ivinghoe (GB)

(73) Assignee: Astrium Limited, Stevenage, Hertfordshire (GB)

( * ) Notice: Subject to any disclaimer, the term of this patent is extended or adjusted under 35 U.S.C. 154(b) by 1041 days.

(21) Appl. No.: 11/794,206

(22) PCT Filed: May 4, 2007

(86) PCT No.: PCT/GB2007/050238
§ 371 (c)(1),
(2), (4) Date: Jun. 26, 2007

(87) PCT Pub. No.: WO2007/129118
PCT Pub. Date: Nov. 15, 2007

(65) Prior Publication Data
US 2008/0278236 A1 Nov. 13, 2008

(30) Foreign Application Priority Data

May 5, 2006 (EP) .................................. 06270045
May 5, 2006 (GB) .................................. 0608815.7

(51) Int. Cl.
*H01Q 11/12* (2006.01)

(52) U.S. Cl. .................. 455/126; 455/127.1; 455/127.2; 455/127.3; 375/296; 375/297; 330/10; 330/136

(58) Field of Classification Search .............. 455/561, 455/73, 63.1, 127.1, 126, 127, 127.2, 127.3; 330/295, 302, 10, 136; 375/297, 296
See application file for complete search history.

(56) References Cited

U.S. PATENT DOCUMENTS

| 5,091,919 A | * | 2/1992 | Kuisma ......................... 375/297 |
| 5,119,042 A | * | 6/1992 | Crampton et al. ............. 330/295 |
| 5,603,106 A | * | 2/1997 | Toda ............................ 455/126 |
| 6,256,482 B1 | | 7/2001 | Raab |

(Continued)

FOREIGN PATENT DOCUMENTS

EP 0 473 299 A2 3/1992

(Continued)

OTHER PUBLICATIONS

Search Report issued in corresponding Application No. GB0608815.7 dated Sep. 1, 2006.

(Continued)

*Primary Examiner* — Junpeng Chen
(74) *Attorney, Agent, or Firm* — Buchanan Ingersoll & Rooney PC

(57) ABSTRACT

A Solid State Power Amplifier (SSPA) for powering a single element of a multi-element antenna, the SSPA comprising:
  an RF amplifier, having a signal amplifying path that includes preamplifier, driver amplifier and a power output stage;
  an Electronic Power Conditioner (EPC) for providing a variable value of DC voltage for powering the power output stage of the RF amplifier;
  a control ASIC for receiving an input power signal of the RF amplifier for providing a voltage control signal to the EPC to determine the value of the DC voltage, the control ASIC addressing an EEPROM holding a collection of control words that define output values of a control output signal for varying values of said input power, such that the value of the DC voltage to the power output stage is varied so as to control the gain compression of the RF amplifier for varying values of input power in order to maintain constant amplifier linearity.

21 Claims, 5 Drawing Sheets

Third Embodiment of the invention

U.S. PATENT DOCUMENTS

| | | | |
|---|---|---|---|
| 6,914,487 | B1 | 7/2005 | Doyle et al. |
| 7,368,985 | B2 * | 5/2008 | Kusunoki ................... 330/10 |
| 7,369,816 | B2 * | 5/2008 | Kappes et al. ............... 455/73 |
| 2002/0086709 | A1 * | 7/2002 | Saito et al. ................. 455/561 |
| 2002/0175764 | A1 * | 11/2002 | Matsuura et al. ............ 330/302 |
| 2003/0034839 | A1 | 2/2003 | Poggi et al. |
| 2003/0045238 | A1 * | 3/2003 | Leizerovich et al. ........... 455/63 |
| 2004/0061555 | A1 * | 4/2004 | Lynch ......................... 330/136 |
| 2004/0246050 | A1 | 12/2004 | Kikuchi |
| 2005/0259450 | A1 | 11/2005 | Kotani et al. |
| 2006/0084398 | A1 | 4/2006 | Chmiel et al. |
| 2007/0178856 | A1 * | 8/2007 | Mitzlaff et al. ............ 455/127.1 |

FOREIGN PATENT DOCUMENTS

| | | | |
|---|---|---|---|
| EP | 0 951 149 A2 | | 4/1999 |
| EP | 1 658 671 | | 5/2006 |
| GB | 2 282 291 A | | 3/1995 |
| GB | 2282291 A | * | 3/1995 |
| GB | 2 412 797 A | | 10/2005 |
| JP | H05-075352 | | 3/1993 |
| JP | H10-285059 | | 10/1998 |
| JP | H11-308124 | | 11/1999 |
| JP | 2002-290247 | | 10/2002 |
| JP | 2003-008365 | | 1/2003 |
| JP | 2004-320418 | | 11/2004 |
| SU | 1429289 A1 | | 10/1988 |
| WO | WO 2004/070941 A3 | | 8/2004 |
| WO | WO 2004/112236 | | 12/2004 |

OTHER PUBLICATIONS

European Search Report.
Seymour, "L Band Power Amplifier Solutions for the Inmarsat Space Segment" IEE Seminar on Microwave and RF Power Amplifiers, 2000, pp. 6/1-6/6.
Tondryk, "Recent Developments in Solid State Power Amplifier Technology and Their Applicability to Third Generation Mobile Space Segment Systems" Fourth International Conference on Satellite Systems for Mobile Communications, 1988, pp. 264-268.
International Search Report and Written Opinion issued in corresponding PCT/GB2007/050238, EPO, Rijswijk, NL.
English translation of Decision on Grant for Russian Patent Application No. 2008147889/09(062720).
Notice of Reasons for Rejection issued in Japanese Patent Application No. 2009-508505 on Jun. 7, 2011.
Notice of Reasons for Rejection issued Feb. 7, 2012 in corresponding Japanese Patent Application No. 2009-508505.

* cited by examiner

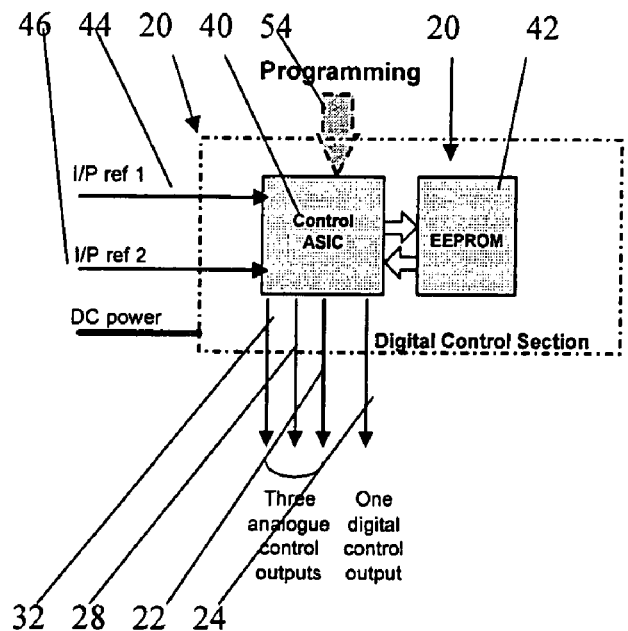
Figure 1.
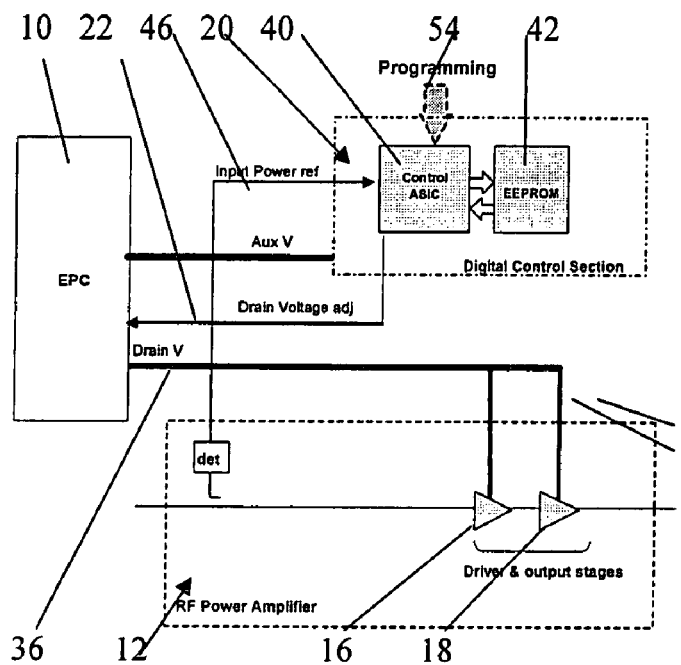
Figure 2. First Embodiment of Invention

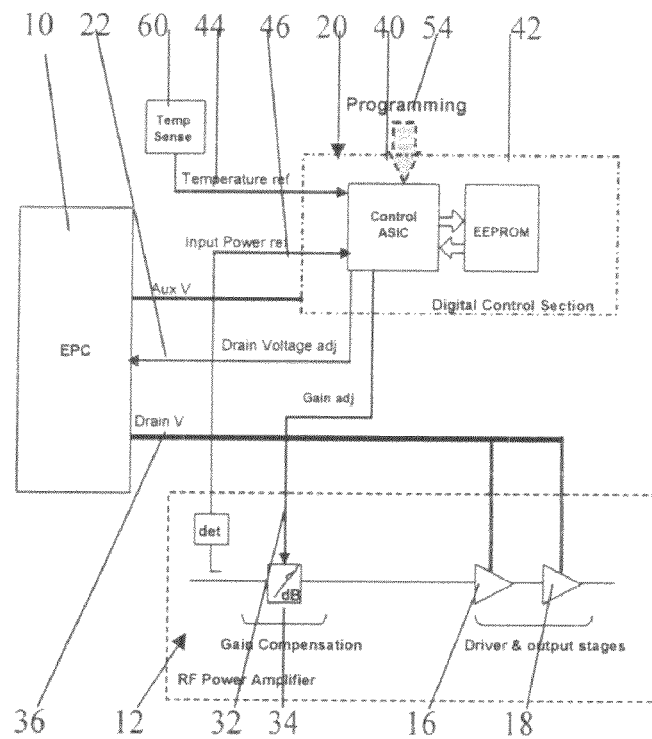
Figure 3. Second Embodiment of Invention
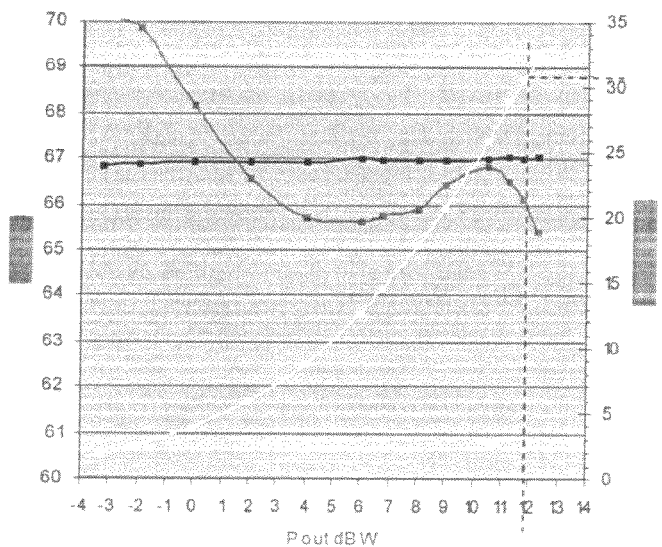
Figure 4. Fixed Bias Class A/B Performance

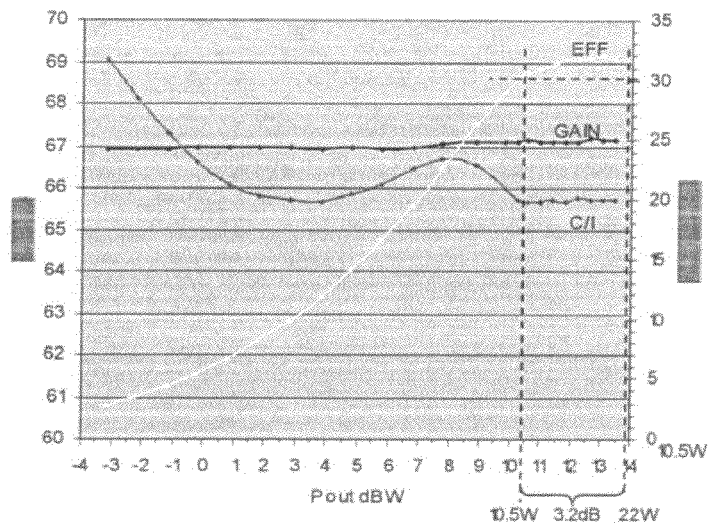
Figure 5. Performance of third embodiment of invention
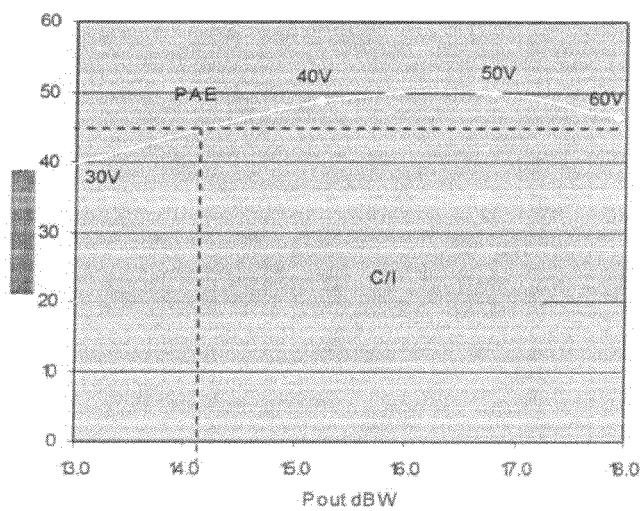
Figure 6. Third embodiment Performance for GaN Output Stage

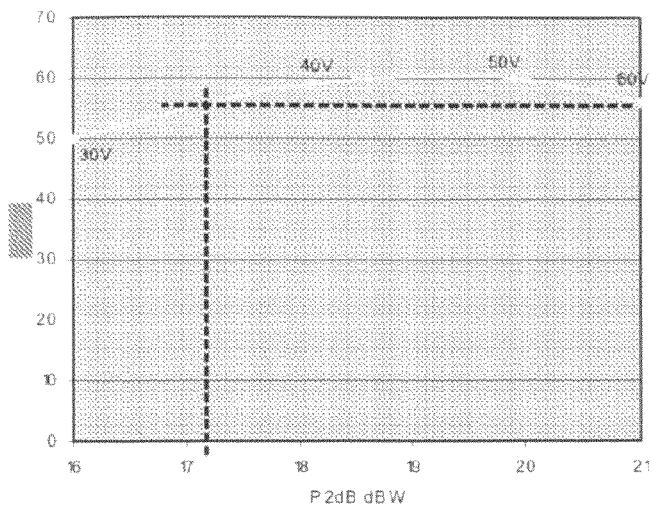
Figure 7. Third embodiment Single Carrier Performance for GaN Output Stage
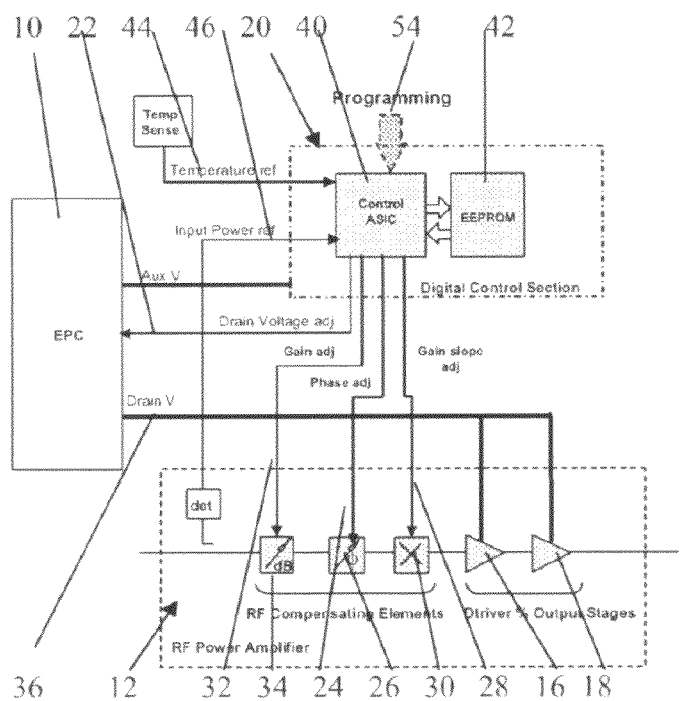
Figure 8. Third Embodiment of the invention

RF POWER AMPLIFIERS

The present Invention relates to RF Power Amplifiers.

BACKGROUND ART

It is a common requirement, particularly for space satellite applications of communications, that each element of a multi-element antenna array, e.g. phased arrays, should be driven by a respective power unit, a single power amplifier. The amplified power signal for each antenna should be accurately controlled in amplitude and phase relative to the other antenna elements. It is common to employ solid state power amplifiers (SSPAs) for this purpose, but the amplifiers must meet stringent linearity, efficiency and gain/phase tracking performances required for operation in active antenna arrays.

The degree of gain compression, efficiency, and linearity of an amplifier can be optimised at a given RF output power by careful selection of the bias conditions. As the amplifier drive is reduced however, the amplifier backs off and the gain becomes less compressed resulting in degraded efficiency. The linearity improves but in many cases this is not an application requirement. When operating in active antenna arrays this results in some or all of the amplifiers running at less than optimum efficiency depending on traffic loading and beam pointing conditions (which may impose an amplitude 'taper' across the array, where amplifiers have a gradually reducing output amplitude across the array).

For the avoidance of doubt, terms used above have the following meaning:

Gain compression: may be defined, for example: a reduction in 'differential' or 'slope' gain caused by nonlinearity of the transfer characteristic of the amplifier. Gain compression may be understood as the degree of deviation from linear amplification as the amplifier approaches its saturation characteristic at maximum amplification.

Back off: the amount by which the input power and output power are reduced as the amplifier operating point moves along its operating characteristic away from a high power condition towards a lower power condition.

Efficiency: the ratio of RF output power for transmission to DC input power provided by a power supply.

Linearity: there are various measures of linearity as described herein, but a common measure is Carrier Intermodulation Ratio (C/I ratio—the ratio of power in the subject channel to power "leakage" in an adjacent channel of a multicarrier system).

The automatic adjusting of amplifier bias to minimise efficiency degradation with back off is disclosed for power amplifiers incorporating Silicon Bipolar Transistors in "Recent developments in solid state power amplifier technology and their applicability to third generation mobile space segment systems" pages 264-268, Fourth International Conference on Satellite Systems for Mobile Communications and Navigation; October 1988. Such technique is an analogue technique involving adjustment of the base emitter voltage of bipolar output transistors. Such technique could not be made to work with amplifiers employing Field Effect Transistors (FETs) and is therefore severely limited for amplifiers in current use.

Other more complex techniques are known—notably Chireix outphasing (LINC) amplifiers and Doherty amplifiers. These arrangements require splitting an input signal into two parallel amplification paths, and then subsequently combining the amplified signals. Such techniques are complicated to set up and are primarily intended to maximise the efficiency at a given back off where the amplifier has to demonstrate very high linearity.

None of the above techniques addresses the requirements of amplifiers operating in modern active array antennas. An essential pre-requisite for such amplifiers is that they must track one another in gain and transmission phase, and in many cases with the amplifiers being operated at different drive levels and temperatures.

In "L Band Power Amplifier Solutions for the INMARSAT Space Segment", IEE Seminar on Microwave and RF Power Amplifiers, 7 Dec. 2000, D. Seymour, pages 6/1-6/6, a system is disclosed for controlling a solid state power amplifier (SSPA) in gain, gain slope and phase, so that these characteristics are accurately held constant and tracked relative to other SSPAs of an array of a large number of SSPAs. The system includes an Electronic Power Conditioner (EPC), which is a power supply adapted for use in space applications. A control ASIC receives an Amplifier Temperature signal and an Amplifier Input Power signal, and accesses digital compensation data held in an EEPROM for providing, in dependence upon the received signals, appropriate analogue control signals for control of gain, gain slope, and phase of the amplifier.

SUMMARY OF INVENTION

An object of the present invention is to provide an amplifier system that may considerably improve characteristics of an amplifier across a wide dynamic range.

In a first aspect, the invention provides an amplifier system for powering an element of an antenna, the amplifier system comprising:

an RF amplifier means, having a signal amplifying path that includes at least a power output stage;

a power supply means for providing a variable value of DC voltage for powering at least said power output stage of said RF amplifier means;

a control means for receiving as a control input an input power signal of said RF amplifier means, for providing, in response to the control input, a voltage control signal to said power supply means to determine the value of said DC voltage;

and said control means being arranged such that the value of said DC voltage to said power output stage is varied so as to control the gain compression of said RF amplifier means for varying values of said input power in order to regulate at least one of amplifier linearity, amplifier efficiency, and thermal dissipation of said RF amplifier means.

In a second aspect, the invention provides an amplifier system for powering an element of an antenna, the amplifier system comprising: an RF amplifier means, having a signal amplifying path that includes at least a power output stage;

a power supply means for providing a variable value of DC voltage for powering at least said power output stage of said RF amplifier means;

a control means for receiving as a control input an input power signal from said RF amplifier means, for providing, in response to the control input, a voltage control signal to said power supply means to determine the value of said DC voltage;

and said control means including storage means that holds a collection of control words that define output values of said voltage control signal for varying values of said input power, whereby to vary the value of said DC voltage and thereby control a predetermined parameter of said RF amplifier means.

The amplifier system in accordance with the invention may feed a single element antenna for space, air or ground-based transmission. However the amplifier system is particularly adapted for driving a respective element of a multi-element antenna or antenna array for spacecraft. Thus a plurality of such amplifier systems are provided driving respective antenna elements, for example conveniently arranged as a Matrix Power Amplifier (MPA).

The amplifier system is preferably a Solid State Power Amplifier (SSPA) adapted for space applications, which includes an RF amplifier, Electronic Power Conditioner, and a control section. The control section may be mounted on the same circuit board, or integrated with, the RF amplifier components. The RF amplifier has an amplifying path commonly including a preamplifier, driver amplifier, and power amplifier or power output stage. As desired, the power output stage may comprise a plurality of amplifier units arranged in a series/parallel array.

The output stage may include one or more power transistors. As preferred with current technology, the power transistors are FETs, but they may be bipolar transistors, or transistors not yet in common commercial use. There are various types of transistor, all regarded as FETs, for example HFET, PHEMT. The power transistors may be of high quality GaAs or GaN, or other materials such as Si, SiGe, SiC, diamond, plastics. Thermionic devices such as TWTA are not excluded.

The power supply means of the amplifier system may comprise an Electronic Power Conditioner (EPC), which is adapted for use in space applications and accepts power from the spacecraft power bus, and provides controlled DC supply voltages (main secondary voltage) for powering the RF amplifier means and control means. For amplifiers with FETs, one DC voltage represents the FET drain voltage. In accordance with the invention the magnitude of the DC supply voltage supplied to the output stage of the RF amplifier is controlled in dependence upon a control input to the power supply from the control means. As preferred the magnitude of the DC supply voltage supplied to the driver stage of the RF amplifier is similarly controlled.

The control means may be, where an SSPA is employed, integrated circuits mounted on the same circuit boards as the RF amplifier; alternatively it may be formed separately from the amplifier. Such control means accepts control inputs from the amplifier, principally input power and temperature, and provides control outputs to control selected parameters of the amplifier, for example gain, transmission phase and gain slope (by adjustment of preamplifier characteristics). In accordance with the invention the control means provides a control output to the power supply means, in order to vary the DC supply voltage to the output power stage of a power amplifier, in order to control selected parameters of the amplifier. Principal parameters for control are linearity and efficiency. However other parameters may be controlled, for example thermal dissipation. As noted above, an important measure of linearity is C/I ratio—however other measures may be employed such as Noise Power Ratio (NPR) or Adjacent Channel Power Ratio (ACPR). C/I ratio is commonly used for multicarrier systems, but ACPR may be used for single carrier systems, where power in side lobes of the single carrier may be determined, relative to power in the main lobe.

A desired control method is to maintain linearity (carrier intermodulation ratio (C/I)) constant, or within desired limits, whilst keeping efficiency within acceptable limits, for varying values of amplifier input, over a desired range of RF power output values Alternatively, thermal dissipation or efficiency may be held constant. In order to do this, the invention controls gain compression, for varying levels of input power, by varying the DC supply voltage to the power output stage of the RF amplifier.

It may be possible for the control to provide the above control method at least partly by digital and analogue circuits, and by telecommand signals. The circuits of the control means may be provided in any convenient form, for example an ASIC has been found convenient. It is preferred and in accordance with the invention to provide an EEPROM or other non-volatile storage means, that holds data, in the form of an array of control words, that define control output values in order to achieve the desired amplifier output conditions. Thus if it is desired to hold linearity constant over a desired range for varying values of RF input power, the control words will comprise an array representing DC power voltages for varying RF input power. Where other inputs are provided, such as temperature, and other outputs, such as RF output power and phase, then the dimensions of the array, and the number of sections of the control words, will be correspondingly increased.

In order to provide the control words, an initial characterising process of the amplifier system is carried out, where the desired parameter of the amplifier such as linearity is digitally steered by means of test equipment to a constant value, while varying the input power over the full range of operating requirements. The DC supply voltage is digitally steered to maintain gain compression of the amplifier output stage at a required value in order to hold linearity constant. Control words are recorded representing appropriate values of DC supply voltage for values of input power. A restricted set of control words may be stored (cardinal points), and an interpolation process may be carried out to define control words for intermediate input/output values.

Thus the present invention, at least in its preferred form, is an integrated on board, autonomous and/or telecommandable control technique where, by means of a mixed analogue and digital electronic circuit coupled to an electronic memory that contains data (obtained from ground test), the linearity and
power added efficiency together with any or all of the parameters gain
gain versus frequency response
transmission phase of a solid state power amplifier are simultaneously automatically maintained at (near) constant levels and above predetermined thresholds while the amplifier is being driven over a wide range of output power levels and subjected to changes in temperature.

The invention may comprise an integrated on board control technique where, by means of controlling the degree of gain compression of an amplifier, significant improvement in the amplifier efficiency can be demonstrated over a wide range of output power levels. The ability to do this has various implications for different amplifier types and applications, and the functionality of the invention can be extended to simultaneously control other parameters of the amplifier if required. Where used in spacecraft, at payload level, the invention is an enabling factor in achieving high performance active antenna arrays for flexible earth coverage and offers potential for eliminating lossy and expensive Output Networks.

The invention provides a unique degree of amplifier flexibility, since there is a potentially problematic interaction with the amplifier gain which, for any real application would be unacceptable and extremely difficult/impractical to achieve by analogue means. This is further emphasised when typical requirements for operation over temperature are taken into consideration.

In an alternative form of the invention, an approach to achieving control of amplifier gain compression and efficiency is via telecommand. In this case the amplifier would demonstrate the required gain compression and efficiency but only at discrete, telecommanded output power settings.

BRIEF DESCRIPTION OF THE DRAWINGS

Preferred embodiments of the invention will now be described with reference to the accompanying drawings, wherein:

FIG. 1 is a schematic diagram of an exemplary control means employed in preferred embodiments of the invention;

FIG. 2 is a schematic block diagram of a first preferred embodiment of the invention;

FIG. 3 is a schematic block diagram of a second preferred embodiment of the invention;

FIG. 4 is a graph illustrating performance characteristics of a prior art SSPA;

FIG. 5 is a graph illustrating performance characteristics anticipated with the present invention;

FIG. 6 is a graph illustrating performance characteristics anticipated with the present invention for a multicarrier system, employing GaN power transistors in the output stage;

FIG. 7 is a graph illustrating performance characteristics anticipated with the present invention for a single carrier system, employing GaN power transistors in the output stage;

FIG. 8 is a schematic block diagram of a third preferred embodiment of the invention;

DESCRIPTION OF THE PREFERRED EMBODIMENT

Figure 10:
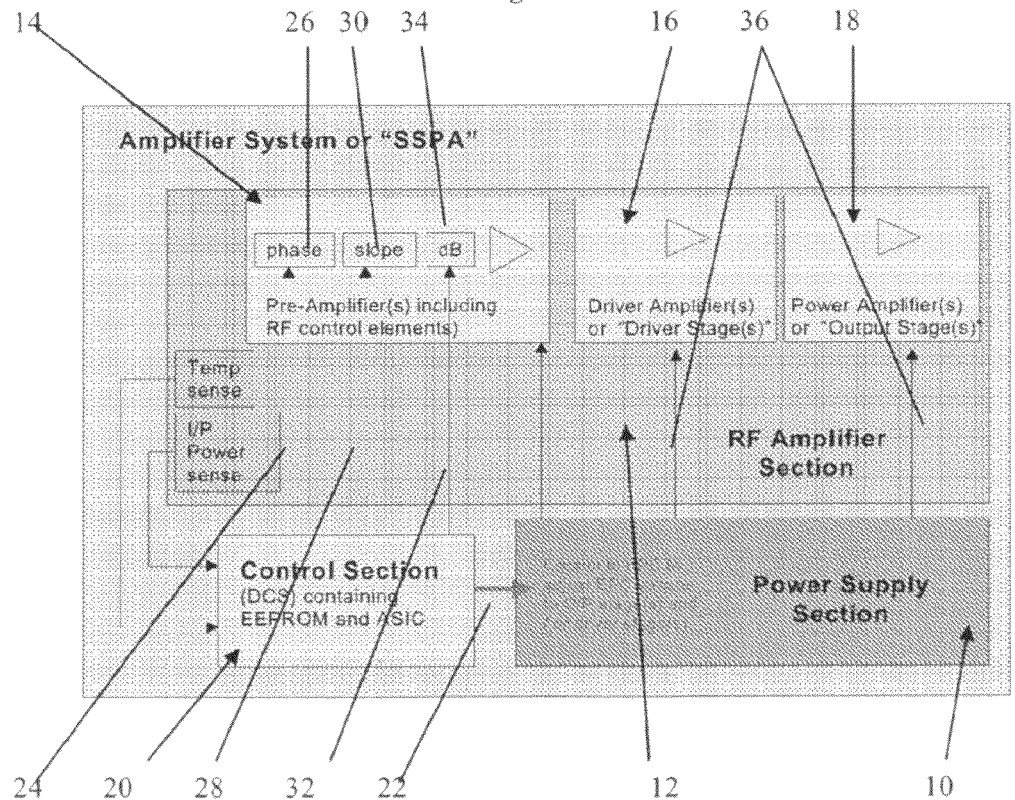
FIG. 10 is a conceptual block diagram of the amplifier system of the present invention, exemplified as a SSPA.

Referring first to FIG. 10, the amplifier system of the invention in one exemplary form is implemented as a solid state power amplifier (SSPA), wherein a power supply section comprises an Electronic Power Conditioner (EPC) 10, an RF amplifier section 12 has an amplifying path including a preamplifier 14, a driver amplifier 16 (driver stage), and a power amplifier 18 (output stage). A control section comprises a digital control scheme (DCS) 20, which provides control outputs to the preamplifier 14, and EPC 10. Specifically, DCS 20 provides an analogue control signal on line 22 to EPC 10, a digital signal on line 24 to phase control 26 in preamp 14 (alternatively an analogue phase control may be used), an analogue control signal on line 28 to gain slope control 30, and an analogue control signal on line 32 to gain control 34 in preamp 14. EPC 10 provides a variable DC supply voltage 36 (drain voltage or drain-source voltage) to output stage 18 and driver stage 16.

Figure 9:
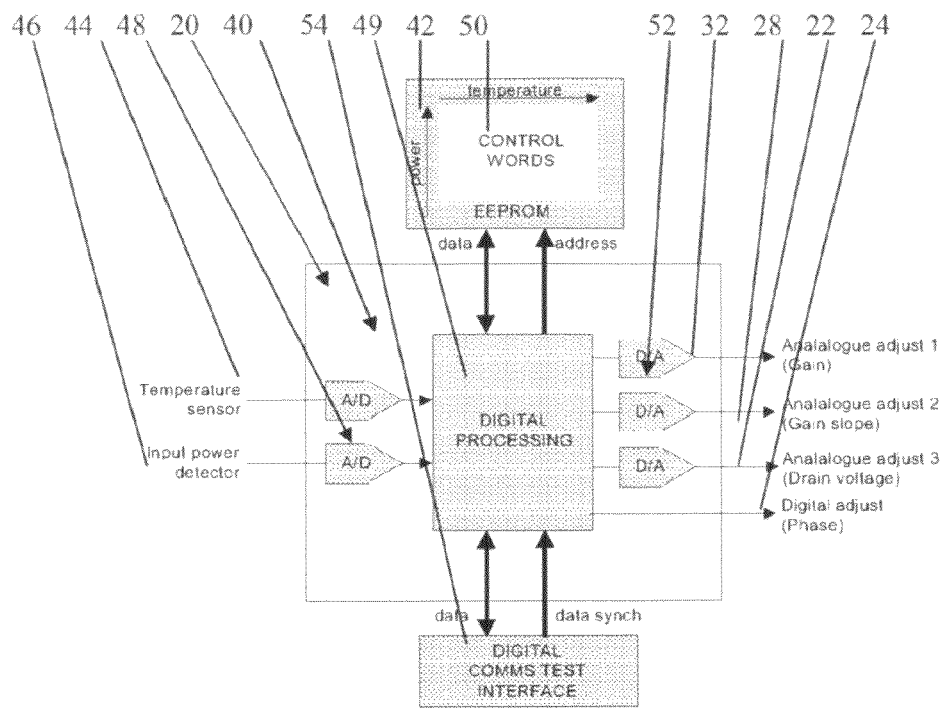
FIG. 9 is a more detailed view of the control means of FIG. 1.

Referring to FIGS. 1 and 9, the DCS 20 consists of a mixed analogue/digital signal Control ASIC 40 and an Electronically Erasable Read Only Memory (EEPROM) 42. The Control ASIC has two analogue input reference ports 44, 46 and three analogue (22, 28, 32) plus one serial digital (24) output control ports available to the user. Essentially the input references 44, 46 (normally temperature and amplifier input power) are digitised in A/D converters 48, and steer the digital processing unit 49 of the Control ASIC to read the relevant control word held in EEPROM. Conveniently, the control words 50 may be stored in matrix form, shown schematically as rows for power input, and columns for temperature input. The accessed control word is then processed by the ASIC and digitised in D/A converters 52 to provide controlling signals at its output ports 22-32. The Control ASIC 40 has an I2C programming interface 54 (other standard interfaces may be employed), whereby the EEPROM 42 can be addressed, loaded and read during an amplifier set up or characterisation process.

For all the embodiments described herein, the working principle of the DCS 20 is that as part of the production process, the amplifier is 'characterised' over the full range of its operating requirements—specifically input power range and temperature. During this characterisation process, those parameters that are required to be controlled are, by means of software and test equipment interfacing with DCS, digitally steered to the desired value and the digital 'control word' thus derived recorded. In this way an array of digital control words 50 or 'cardinal points' are collected. Software may interpolate between the cardinal points to arrive at a full 'correction array' that is loaded into EEPROM 42. Alternatively, only the cardinal points are stored in EEPROM 42 with the interpolation being done in real time by the ASIC 40. In both schemes the result is that the EEPROM data, via circuits in the ASIC is used to drive correcting elements included in the amplifier design to achieve the requisite performance.

FIG. 2 illustrates a first embodiment of the invention, similar parts to those of FIGS. 1, 9 and 10 being denoted by the same reference numeral (and for all subsequent figures). In this case the DCS 20 is supplied with a single input reference 46 from the RF amplifier 12, that being a voltage related to its input power. Only one of the DCS analogue outputs, 22, is used and this interfaces with the EPC 10 to control the main voltage supply 36 to the driver and output FET drains 16, 18. During the characterisation process the amplifier is exercised over its full input power dynamic range, and through the aforementioned software and test equipment, the EPC main output voltage 36 is digitally steered to maintain the RF amplifier driver and output stages 16, 18 at the required gain compression, in order to maintain a constant C/I ratio.

The embodiment of FIG. 2 is a minimal configuration. In practice, the amplifier gain may change as the drain supply to the driver and output FETs is adjusted and there will be temperature effects that may have to be dealt with. A second embodiment shown in FIG. 3 therefore illustrates a configuration of the invention, of more practical use, where the DCS 20 is also used to maintain the overall gain of the amplifier at a constant level over the operating dynamic range and temperature. A second reference input 44 is now supplied to the DCS 22 from a temperature sensor 60 mounted on the amplifier board, and a second analogue output 32 is used to drive a variable attenuator 34 (or other digital or analogue variable gain/loss device) in the RF chain. The characterisation process now exercises the amplifier over its full input power dynamic range and over the operating temperature range. In this way data is collected to not only adjust the gain compression with input drive, but also to zero out any unwanted variations in the gain compression and absolute gain with temperature.

A comparison between the performances of a fixed class A/B biased amplifier optimised for a particular output power requirement, and that anticipated with the invention is given in FIGS. 4 & 5. The amplifier employs GaAs driver and output FETs and includes a pre-amplifier section to boost the gain. FIG. 4 illustrates a fixed bias case where bias conditions, in particular the drain voltage supply, have in this case been adjusted and fixed to achieve optimum performance at a normal operating point (NOP) of, in this case just under 12.0 dBW. It is seen that a peak efficiency of 31% is achieved at an associated three tone carrier to intermodulation ratio (C/I) of 20 dB; this value being a typical figure of merit for a mobile power amplifier. As the amplifier is backed off however, the efficiency degrades quite rapidly; there is an improvement in C/I but this is generally not a system requirement. Because this amplifier is equipped with a DCS configured to control the overall amplifier gain over the dynamic range, the fact that the amplifier is 2 dB gain compressed at NOP is masked.

FIG. 5 illustrates enhanced performance of the same amplifier incorporated into the embodiment of FIG. 3. In this case the function of the DCS 20 is extended to automatically maintain the amplifier C/I at a level of 20 dB over a output power dynamic range of just over 3 dB. The control of gain compression to achieve this is masked by the DCS also controlling the overall amplifier gain. It will immediately be seen that although the peak efficiency is no higher than for the fixed bias case, the efficiency at back off is greatly improved, being better than 30% in the output power range 10.5 W to 22 W. The dynamic range over which this performance can be achieved is dependent on the minimum acceptable linearity (C/I) required but is ultimately limited by the acceptable voltage limits for the driver and output FETs.

It should be noted that the invention can equally be applied to achieving a constant efficiency or even constant dissipation characteristic over a given dynamic range.

The present invention may be applied to FETs incorporating Gallium Nitride (GaN) wide band gap technology, and much wider dynamic ranges can be achieved due to the larger drain voltage range permitted with these parts.

FIG. 6 shows the anticipated performance of a single GaN output stage in multicarrier operation and with the invention applied to maintain C/I constant at 20 dB. In this case an efficiency of better than 45% is maintained over an output power dynamic range of nearly 4 dB (63 W to 26 W).

FIG. 7 illustrates the anticipated performance for the same GaN output stage in single carrier operation where, in this case, the gain compression has been controlled to a constant 2 dB. It is seen that an efficiency of better than 56% is maintained over an output power range of 126 W to 52 W.

FIG. 8 illustrates a third embodiment of the invention, where the DCS 20 is extended to its full capability as applied to an amplifier operating in a mobile satellite transmit phased array antenna. Here the amplifiers are all required to track one another in gain and transmission phase over temperature and whilst operating at different RF drive levels. Thus as compared with the second embodiment of FIG. 3, control lines 24, 28, controlling phase and gain slope 26, 30 are provided. The DCS is now used to achieve the performance indicated in FIGS. 5 to 7 whilst simultaneously controlling the amplifier over the required dynamic range and temperature:

overall gain
transmission phase
amplitude vs. frequency response

In a modification of the present invention, an approach to achieving control of amplifier gain compression and efficiency is via telecommand in this case the amplifier demonstrates the required gain compression and efficiency but only at discrete, telecommanded output power settings. In response to telecommand input to EPC 10, the EPC10 changes the drain supply voltage 36 to the RF amplifier 12 to a pre-determined value. Several such values could be commanded. This would give an approximate form of control that may be acceptable in some circumstances.

In practice the amplifier gain will change when the commanded drain voltage is changed and this may have to be compensated. Further, temperature compensation of gain may be required. Hence such telecommand alternative may desirably include a DCS 20 including an EEPROM 42 for compensating for gain change. If the amplifier were required to demonstrate a constant gain and phase performance required of operation in phased arrays then a DCS analogous to that in FIG. 8 may be used, an EEPROM data correction matrix being stored for each telecommanded level.

The invention claimed is:

1. An amplifier system for powering an element of an antenna, the amplifier system comprising:
   an RF amplifier means, having a signal amplifying path that includes at least a power output stage;
   a power supply means for providing a variable value of DC voltage for powering at least said power output stage of said RF amplifier means; and
   a control means for receiving, as a first control input, an input power signal of said RF amplifier means and, as a second control input, a temperature signal of said RF amplifier means and for providing, based on the first control input and the second control input, a voltage control signal to said power supply means to determine the value of said DC voltage, wherein said control means are arranged such that the value of said DC voltage to said power output stage is varied so as to control the gain compression of said RF amplifier means for varying values of said input power and temperature in order to regulate at least one of amplifier linearity, amplifier efficiency, and thermal dissipation of said RF amplifier means.

2. The amplifier system according to claim 1, wherein said control means are arranged such that the value of said DC voltage to said power output stage is varied so as to control the gain compression of said RF amplifier means for varying values of said input power and temperature in order to regulate the amplifier linearity of said RF amplifier means such that the amplifier linearity is maintained constant, or within predetermined limits, over a desired range.

3. The amplifier system according to claim 1, wherein said RF amplifier means include preamplifier means having means to vary at least one of amplifier gain, amplifier gain slope, and transmission phase, and
   wherein said control means provides at least one control output signal for control of the at least one of the amplifier gain, the amplifier gain slope, and the transmission phase.

4. The amplifier system according to claim 3, wherein the control means includes storage means that holds a collection of control words that define values of said voltage control signal for varying values of said input power.

5. The amplifier system according to claim 4, wherein said collection of control words define values of said one control output signal for varying values of said input power signal and/or said temperature signal.

6. The amplifier system according to claim 1, wherein said RF amplifier means includes a driver stage, and
   wherein said power supply means being arranged to provide said variable value of DC voltage to said driver stage.

7. The amplifier system according to claim 1, wherein the control means is arranged to provide telecommanded signals to said power supply means to determine the value of said DC voltage.

8. The amplifier system according to claim 1, wherein the control means includes storage means that holds a collection of control words that define values of said voltage control signal for varying values of said input power signal and said temperature signal.

9. The amplifier system according to claim 8, wherein said control means includes circuit means for receiving said first and second control inputs of the input power signal and the temperature signal, respectively, for addressing in response thereto said storage means to access one of said control words, and for providing said voltage control signal with a value determined by said one of said control words.

10. An amplifier system according to claim 9, wherein said RF amplifier means include preamplifier means having means to vary at least one of amplifier gain, amplifier gain slope, and transmission phase, and
  wherein said control means provides at least one control output signal for control of the at least one of the amplifier gain, the amplifier gain slope, and the transmission phase.

11. The amplifier system according to claim 10, wherein said collection of control words define values of said one control output signal for varying values of said input power signal and/or said temperature signal.

12. The amplifier system according to claim 1, wherein said power output stage includes at least one power transistor.

13. The amplifier system according to claim 12, wherein said one power transistor comprises an FET.

14. The amplifier system according to claim 1, comprising a solid state power amplifier that includes one or more circuit boards on which said RF amplifier means and said control means are mounted, wherein said power supply means includes an Electronic Power Conditioner.

15. The amplifier system according to claim 14, where the antenna is a single element of a multi-element antenna.

16. The amplifier system according to claim 1, where the antenna is a single element of a multi-element antenna.

17. An amplifier system for powering an element of an antenna, the amplifier system comprising:
  an RF amplifier means, having a signal amplifying path that includes at least a power output stage;
  a power supply means for providing a variable value of DC voltage for powering at least said power output stage of said RF amplifier means; and
  a control means for receiving, as a first control input, an input power signal from said RF amplifier means and, as a second control input, a temperature signal of said RF amplifier means, for providing, based on the input power signal and the temperature signal, a voltage control signal to said power supply means to determine the value of said DC voltage, the control means including storage means that holds a collection of control words that define output values of said voltage control signal for varying values of said input power signal and said temperature signal, to vary the value of said DC voltage and thereby control a predetermined parameter of said RF amplifier means.

18. The amplifier system according to claim 17, wherein said control means including circuit means for receiving said first and second control inputs of the input power signal and the temperature signal, respectively, and for addressing in response thereto said storage means to access one of said control words, and for providing said voltage control signal with a value determined by said one control word.

19. The amplifier system according to claim 17, wherein said RF amplifier means include preamplifier means having means to vary at least one of amplifier gain, amplifier gain slope, and transmission phase, wherein said control means provides at least one control output signal for control of the at least one of the amplifier gain, the amplifier gain slope, and the transmission phase, and
  wherein said collection of control words define values of said at least one control output signal for varying values of said input power signal and/or said temperature signal.

20. A method of controlling an amplifier system for powering an element of an antenna, the amplifier system comprising:
  an RF amplifier means, having a signal amplifying path that includes at least a power output stage; and
  a power supply means for providing a DC voltage for powering at least said power output stage of said RF amplifier means, the method comprising:
  monitoring the input power to said RF amplifier means and the temperature of the RF amplifier means; and
  varying, based on said input power and temperature, the value of said DC voltage so as to control the gain compression of said RF amplifier means for varying values of said input power and temperature in order to regulate at least one of amplifier linearity, amplifier efficiency, and thermal dissipation of the RF amplifier means.

21. An amplifier system for powering an element of an antenna, the amplifier system comprising:
  an RF amplifier having a signal amplifying path that includes at least a power output stage;
  a power supply configured to provide a variable value of DC voltage for powering at least said power output stage of said RF amplifier;
  a controller configured to receive, as a first control input, an input power signal of said RF amplifier and, as a second control input, a temperature signal of the RF amplifier, and configured to provide, based on the input power signal and the temperature signal, a voltage control signal to said power supply to determine the value of said DC voltage,
  wherein said controller is configured such that the value of said DC voltage to said power output stage is varied so as to control the gain compression of said RF amplifier for varying values of said input power and temperature in order to regulate at least one of amplifier linearity, amplifier efficiency, and thermal dissipation of said RF amplifier.

* * * * *